United States Patent
Deimling

(10) Patent No.: US 8,395,387 B2
(45) Date of Patent: Mar. 12, 2013

(54) METHOD FOR IMAGING IN MAGNETIC RESONANCE TOMOGRAPHY WITH SPECTRAL FAT SATURATION OR SPECTRAL WATER EXCITATION

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 242 days.

(21) Appl. No.: 12/766,181

(22) Filed: Apr. 23, 2010

(65) Prior Publication Data

US 2010/0271023 A1    Oct. 28, 2010

(30) Foreign Application Priority Data

Apr. 24, 2009  (DE) .......................... 10 2009 018 878

(51) Int. Cl.
   *G01V 3/00*  (2006.01)
(52) U.S. Cl. ...................................................... 324/309
(58) Field of Classification Search ........... 324/300–322
   See application file for complete search history.

(56) References Cited

U.S. PATENT DOCUMENTS

| 4,899,109 A * | 2/1990 | Tropp et al. .................... | 324/320 |
| 2007/0013375 A1* | 1/2007 | Akao et al. ..................... | 324/309 |
| 2007/0167727 A1* | 7/2007 | Menezes et al. ............. | 600/410 |
| 2010/0241389 A1* | 9/2010 | Griswold et al. ............. | 702/106 |

OTHER PUBLICATIONS

Larkman, et al., A Feasibility Study of Detection and Correction of Motion Artifacts in MR Imaging of the Larynx Using Parallel Imaging, Proc. Intl. Soc. Mag. Reson. Med. 10, 2002, Fig. 2.*
"MR Imaging: Clinical Use of the Inversion Recovery Sequence," Bydder et al., Journal of Computer Assisted Tomography, vol. 9, No. 4 (1985) pp. 659-675.
"Three-Point Dixon Technique for True Water/Fat Decomposition with $B_0$ Inhomogeneity Correction," Glover et al., Magnetic Resonance in Medicine, vol. 18 (1991) pp. 371-383.
"Simultaneous Highly Selective MR Water and Fat Imaging Using a Simple New Type of Spectral-Spactial Excitation," Schick, Magnetic Resonance in Medicine, vol. 40 (1998) pp. 194-202.
"Simultaneous Spatial and Spectral Selective Excitation," Meyer et al., Magnetic Resonance in Medicine, vol. 15 (1990) pp. 287-304.
"$^1$H NMR Chemical Shift Selective (CHESS) Imaging," Haase et al., Phys. Med. Biol., vol. 30, No. 4 (1985) pp. 341-344.

* cited by examiner

*Primary Examiner* — Melissa Koval
*Assistant Examiner* — Daniel Miller
(74) *Attorney, Agent, or Firm* — Schiff Hardin LLP

(57) ABSTRACT

A magnetic resonance tomography (MRT) method with spectral fat saturation or spectral water excitation in a tissue region that is to be represented of a patient who is to be examined, includes the following steps: (Step 1) frequency adjustment measurement of a region of a patient that is to be represented with a selected first partial coil of the MRT system, (Step 2) precise determination of the resonance frequency of water with the aid of the spectrum obtained in Step 1 exhibiting the resonance frequencies of fat and water, (Step 3) repetition of Steps 1 and 2 with at least one additionally selected second partial coil of the MRT system adjacent to the first partial coil, (Step 4) measuring of a k space data record with a partial coil or a partial coil combination on the basis of the water resonance frequency assigned to these partial coils, (Step 5) repetition of Step 4 with other partial coils or other partial coil combinations until the entire tissue region to be represented has been measured, (Step 6) combining of the measuring results obtained in Steps 4 and 5, and (Step 7) representing of the results obtained in Step 6 in the image space in the form of an overall image of the tissue region to be represented.

5 Claims, 4 Drawing Sheets

No Fat Saturation

Water Saturation

METHOD FOR IMAGING IN MAGNETIC RESONANCE TOMOGRAPHY WITH SPECTRAL FAT SATURATION OR SPECTRAL WATER EXCITATION

BACKGROUND OF THE INVENTION

1. Field of the Invention

The present invention relates in general to resonance tomography (MRT), as IS applicable in medicine for the examination of patients. The present invention relates in particular to an MRT method in which the image quality is improved in the case of images with spectral saturation or excitation.

2. Description of the Prior Art

Magnetic resonance tomography is a tomographic imaging modality for medical diagnostics, which is characterized first and foremost by a high contrast resolution capability. On the basis of an outstanding ability to represent soft tissue, magnetic resonance tomography has developed to a method far superior to X-ray computed tomography. Magnetic resonance tomography today is based on the application of spin echo and gradient echo sequences, which in the case of measuring times of the order of minutes makes an excellent image quality possible.

The presence of both fat and water tissue in a patient constitutes one challenge in magnetic resonance imaging. Due to the phenomenon known as the chemical shift, artifacts arise at the boundary layers between fatty tissue and aqueous tissue, which it is necessary to eliminate. Additionally, the fat signal often reduces the distinguishability of details in MR images both in $T_1$-imaging and in $T_2$ imaging because of its high signal contribution to the overall MR signal.

Chemical shift refers to the fact that the resonant frequency of the MR signal emitted by a nucleus will shift slightly in proportion to the magnetic field in which the nucleus is located, dependent on the type of chemical bond in which the nucleus participates. On the basis of their concentration in the human body, mainly hydrogen nuclei in free water and in fat contribute to the image. Their relative resonance frequency difference amounts to about 3 ppm (parts per million). As a result, in the case of the use of spin echo as well as gradient echo sequences, there is a modulation of the signal intensity that is dependent on the echo time TE.

According to the state of the art there are currently three basic methods for eliminating the disturbing fat signal:

1) The so-called STIR technology (STIR: Short Inversion Recovery),
2) Phase methods, which use the so-called 1-, 2- or 3-Punkt-Dixon-Verfahren, as well as
3) The spectral saturation method.

STIR is an IR sequence (Inversion Recovery sequence) with short inversion time. In the case of IR sequences the longitudinal magnetization is first inverted by a 180°-Puls in the opposite direction.

At the time when all fat protons are in a magnetization state Mz=0, a 90° excitation pulse is applied. Since the fat protons do not contribute to the resulting overall signal, the fat on the images obtained in this manner is suppressed and with this appears black.

Along with the relatively long acquisition time the disadvantage of STIR is among other things the relatively low overall signal yield (poor signal to noise ratio with low anatomical detail of the image). Another disadvantage is the fact that STIR cannot be used for contrast agent based MRT measurements.

Dixon methods are MR techniques for fat-water separation, which utilize the different resonant frequencies of fat and water protons (the chemical shift itself). Essentially in-phase images and opposite-phase images are acquired, and through whose mutual addition and/or subtraction pure water images and/or pure fat images can be generated.

However, the 2-point Dixon method fails in the case of voxels, in which the signals of fat and water in cancel each other out, which thus contain approximately equal amounts of water and fat. In such a case the phase between fat and water disappears in the signal noise.

For various reasons (shorter measuring time, better contrasts, less expensive post-processing) spectral (fat and water respectively) saturations and (water and fat respectively) excitation methods have advantages vis-à-vis the methods according to 1) and 2). The present invention is concerned with improving spectral saturations and excitation methods.

In the case of spectral fat saturation methods prior to every k-space measurement in the frequency encoding direction (measurement of a k-space line) spectrally selective RF-excitation pulse is emitted, which excites only the fat, and the longitudinal magnetization in the fat is converted to a transverse magnetization. This in turn is immediately dephased with the use of a magnetic field gradient. The directly following excitation pulse of the imaging sequence then no longer finds any convertible longitudinal magnetization and the fatty tissue thus does not get represented.

A complete and consistent fat saturation requires at least one homogenous magnetic field ($B_0$ field) over a majority of the FOV's of the respective sub-coils of the RF (radio-frequency) antenna arrangement, so that the two lines (fat and water) in the spectrum can be cleanly separated. In the presence of ferromagnetic or metallic objects (implants, buttons, jewelry) or in the case of a wide variety of tissue types with different magnetic susceptibility regions (neck, thorax, knee) there are significant local magnetic field inhomogeneities, which ultimately leads to a local variability of the resonant frequencies.

One possibility for adjusting the homogeneity of the magnetic field is called "shimming". For this reason most MRT systems have so-called shim coils, which are able to compensate to a great extent even more complex spatial progressions of magnetic field inhomogeneities.

However in the regions of the cervical vertebral column that have already been mentioned as well as in the knee, the many different tissue volumes change over a few centimeters so starkly that, due to the changing susceptibility values associated with this (tissue to air approximately 6 ppm), the $B_0$ field variation with respect to the overall image cannot be compensated in spite of the shimming.

If in this case the frequency adjustment measurement necessary for shimming and for setting the device to the resonant frequency is carried out prior to the actual MR measurement, a fat-water spectrum is obtained that is composed of offset lines (doublet spectrums) of the different image regions. By a summation of the spectra, from a number of clean doublet spectra, one unclean triplet spectrum is brought about by the shift, and due to this triplet spectrum the resonant frequency (e.g. $W_0$ for water) no longer is able to be exactly determined.

Within the scope of the necessary frequency adjustment (also after preceding shimming) the resonant frequency can then only be set with insufficient precision from the measured superimposed lines of the spectrum, which in individual critical partial images leads to undesirable saturation effects.

SUMMARY OF THE INVENTION

An object of the present invention is to provide a magnetic resonance data acquisition method with spectral saturation or excitation in which the image quality is significantly improved.

The invention relates to a method for imaging in magnetic resonance tomography with spectral fat saturation or spectral water excitation in a tissue region that is to be represented of a patient being examined, with the following steps:

Step 1: Frequency adjustment measurement of a region of a patient that is to be represented with a selected first sub-coil of the RF antenna arrangement of the MRT system, Step 2: Precise determination of the resonance frequency of water with the aid of the spectrum obtained in Step 1 exhibiting the resonance frequencies of fat and water, Step 3: Repetition of Steps 1 and 2 with at least one additionally selected second sub-coil of the MRT system adjacent to the first partial coil, Step 4: Measuring a k space data record with a sub-coil or a sub-coil combination on the basis of the water resonance frequency assigned to these sub-coils Step 5: Repetition of Step 4 with other sub-coils or other sub-coil combinations until the entire tissue region to be represented has been measured, Step 6: Combining the measuring results obtained in Steps 4 and 5, and Step 7: Representing the results obtained in Step 6 in the image space in the form of an overall image of the tissue region to be represented.

Advantageously in Steps 4 and 5 parallel partial acquisition is used for measuring, by which each measurement realizes undersampling in the k space, wherein the totality of the undersamplings again represents a complete k space data record.

Likewise advantageously the combining in Step 6 takes place either by means of a PPA reconstruction algorithm (such as for example GRAPPA, SENSE, SMASH or with their respective derivatives) for example with subsequent addition of the sum of squares.

The measuring in Steps 4 and 5 takes place advantageously either on the basis of a spectral fat saturation sequence or on the basis of a spectral water excitation sequence.

It is additionally advantageous for the frequency adjustment measurement to be preceded by shimming of the region to be represented.

The present invention also encompasses a non-transitory computer-readable storage medium encoded with programming instructions that, when executed by a computerized system in which the storage medium is loaded, cause the computerized system to execute the steps described above, as well as all embodiments.

DESCRIPTION OF THE PREFERRED EMBODIMENTS

Figure 1:
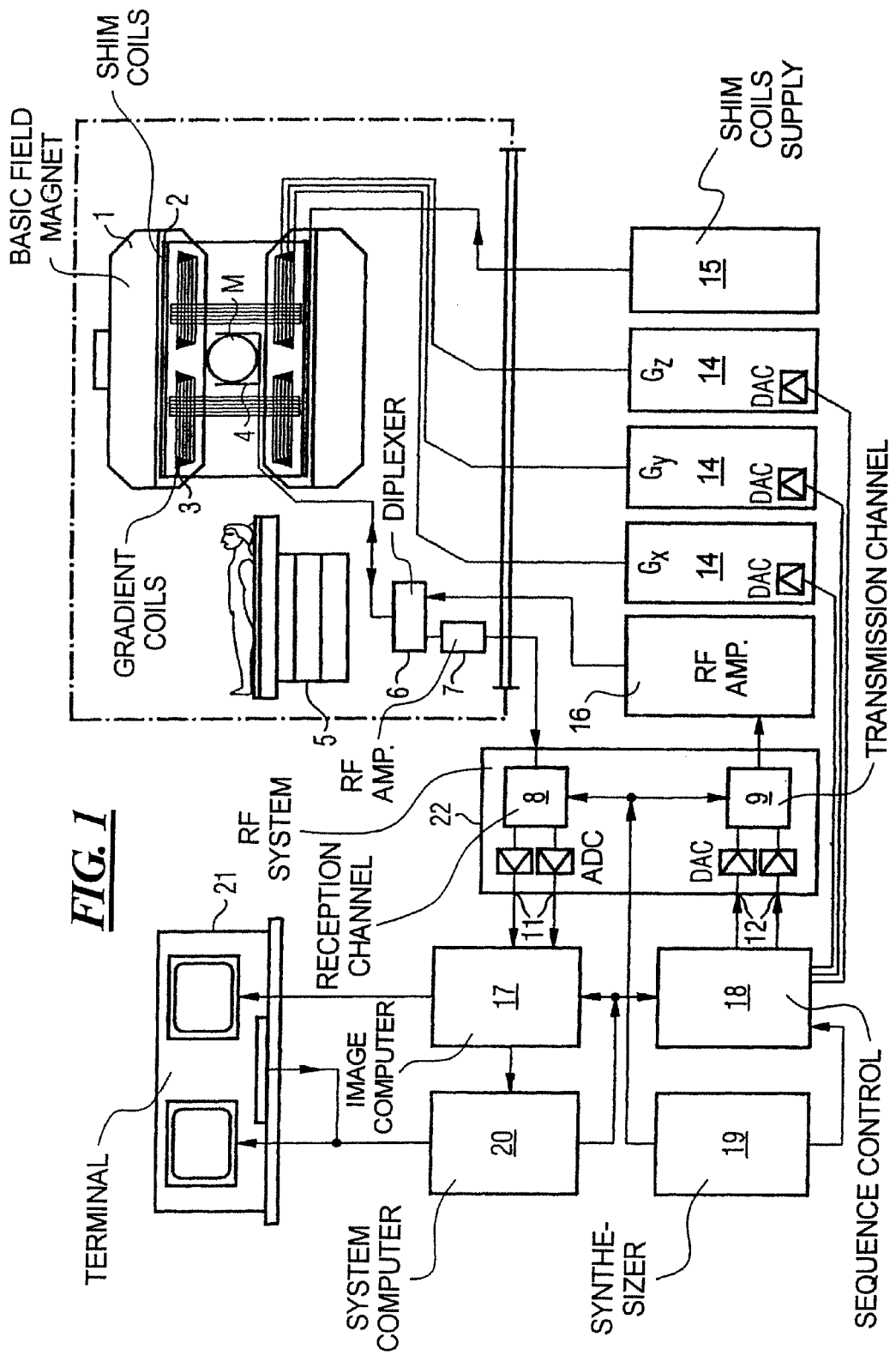
FIG. 1 schematically illustrates a magnetic resonance tomography apparatus constructed and operating in accordance with the present invention.

FIG. 1 schematically shows a magnetic resonance imaging (tomography) device for the generation of a magnetic resonance image of an object in accordance with the present invention. The basic components of the tomography device correspond to those of a conventional tomography device, with differences discussed below. A basic field magnet 1 generates a temporally constant strong magnetic field for polarization or alignment of the nuclear spin in the region under examination of an object, e.g., a part of a human body to be examined. The high homogeneity of the basic field magnet required for the magnetic resonance data acquisition is defined in a measurement volume V, in which the parts of the human body to be examined are inserted. For support of the homogeneity requirements and in particular for the elimination of temporally invariable influences, so-called shims made of ferromagnetic material are mounted at suitable locations. Temporally variable influences are eliminated by shim coils 2, which are actuated by a shim power supply 15.

A gradient coil system 3 is placed into the basic field magnet 1, this gradient coil system being formed by several windings, so-called sub-windings. Each sub-winding is supplied with power by an amplifier 14 for the generation of a linear gradient field in one direction of a Cartesian coordinate system. The first sub-winding of the gradient field system 3 generates a gradient G, in the x-direction, the second sub-winding generates a gradient $G_y$ in the y-direction and the third sub-winding generates a gradient $G_z$ in the z-direction. Each amplifier includes a digital-analog converter, which is actuated by a sequence controller 18 for generation of gradient pulses at the desired time.

Within the gradient field system 3 there is a radio-frequency antenna 4, which converts the radio-frequency pulses emitted by a radio frequency power amplifier 16 into am electromagnetic field for excitation of the spins out of the alignment of the nuclear spin of the object to be examined or of the region of the object to be examined that is caused by the basic magnetic field. The radio-frequency antenna 4 is composed of one or more RF-transmission coils and several RF-reception coils in the form of e.g. a linear arrangement of component coils in PPA (partial parallel acquisition) imaging systems. From the RF-reception coils of the radio-frequency antenna 4 the AC field emitted by the precessing nuclear spins, (generally the echo signals generated from a pulse sequence of one or more radio-frequency pulses and one or more gradient pulses) are converted to a voltage that is supplied to a radio-frequency reception channel 8 of a radio-frequency system 22 via a 7. The radio-frequency system 22 includes a transmission channel 9, in which the radio-frequency pulses for the excitation of the nuclear spins are generated. The respective radio-frequency pulses are digitally represented as a sequence on the basis of a pulse sequence predefined by the system computer 20 in the sequence controller 18. This number sequence is supplied as a real and as an imaginary part to a digital-analog converter in the radio-frequency system 22 via an input 12 and from this digital-analog converter to a transmission channel 9. In the transmission channel 9 the pulse sequences are modulated on to a radio-frequency carrier signal whose base frequency corresponds to the resonant frequency of the nucleus type in the measurement volume to be excited.

The switch from transmission to reception mode takes place via a duplexer 6. The RF-transmission coil of the radio-frequency antenna 4 radiates the radio-frequency pulses for excitation of the nuclear spins in the measurement volume V and samples resulting echo signals via the RF-reception coils. The correspondingly obtained nuclear resonance signals are phase sensitively demodulated in the reception channel 8 of the radio-frequency system 22 and are converted via respective analog-digital converters to a real part and an imaginary part of the measurement signal. An image is reconstructed from the measurement data thus obtained by means of an image processor 17. The administration of the measurement data, the image data and the control programs takes place via the system computer 20. On the basis of a default with control programs the sequence controller 18 controls the generation of the respective desired pulse sequences and the corresponding sampling of k space. In particular the sequence controller 18 controls the switching of the gradients, the emission of the radio-frequency pulses with defined phase and amplitude as well as the reception of the magnetic resonance signals. The time base for the radio-frequency system 22 and the sequence controller 18 is made available by a synthesizer 19. The selection of corresponding control programs for the generation of a magnetic resonance image as well as the representation of the generated image takes place via a terminal 21, which has a keyboard as well as one or more monitors.

In order to be able to carry out spectral fat saturation measurements and spectral excitation measurements with an MRT device it is currently practice to cover the different regions of the object with different partial coils (adjacent partially overlapping excitation and reception coils). Thus, for example, there are coils arranged in the region of the head, coils in the region of the neck and vertebral column, in the region of the lower body as well as in the region of the legs and feet. In order to be able to create contiguous images over a greater anatomical region more or less seamlessly, it is necessary to have the coils overlap one another and that they can be randomly interconnected depending on the desired image region.

Additionally it is conventional to carry out adjustment measurements with an MRT device within the scope of spectral saturation measurements and excitation measurement frequency, said measurements yielding a fat-water NMR spectrum over the entire image region that is to be measured.

Figure 2:
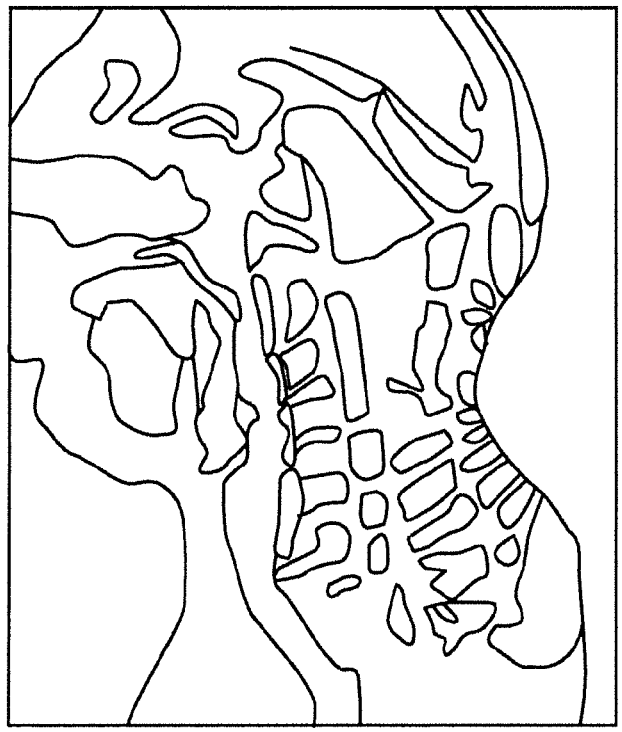
FIG. 2 shows the inhomogeneity of the B0 field in the region of the head and of the cervical vertebral column on the basis of drastically changing tissue susceptibilities.

However, as can be seen from FIG. 2, there are body regions (in FIG. 2 the neck) that exhibit extreme $B_0$ field inhomogeneities. The image in FIG. 2 shows a sagittal section through the vertebral column and for demonstration purposes was recorded with a special (stripe) MR sequence which is able to visualize and quantify B0 field distributions.

So-called zebra stripes can be seen from the back of the head over the neck to the upper part of the shoulder, which are caused by strong $B_0$ field changes (ca. 1 ppm from stripe to stripe) and which are especially pronounced in the region of the neck. The cause for this are, as stated, tissue specific susceptibility changes, as well as also distinctive volume changes (sever tapering of the body volume in the area of the knee and neck).

With the use of an additional special MR sequence (similar to an MR sequence in MR spectroscopy) it is possible, and for a frequency adjustment measurement also necessary, to acquire the MR resonance signal in the fat and water region from a total image region of interest. The objective is the determination of the water peak in order to be able to adjust the MRT device as usual to the MR signal of water protons.

Figure 3:
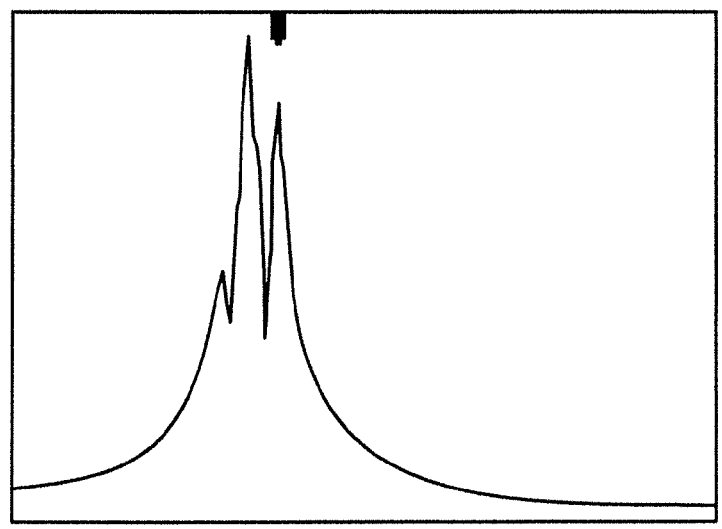
FIG. 3 shows the spectral result of a frequency adjustment measurement from the FOV of FIG. 2.

If the $B_0$ field were absolutely homogeneous in the entire image region to be viewed (FIG. 2), there would be a doublet as a spectrum with a broad but pronounced fat signal on the left and a sharper water peak on the right (depending on the direction of the frequency axis). The inhomogeneities of the $B_0$ field in different image regions cause a shifting of the respective spectra along the frequency axis. The summation of the offset doublets, which ultimately leads to the resulting overall signal, yields a spectrum in the form of an unclean triplet, as shown in FIG. 3.

A precise determination of the water peak is no longer possible here, but rather can now only be roughly estimated. The MRT device cannot be precisely adjusted to the resonance of water protons.

Figure 4:
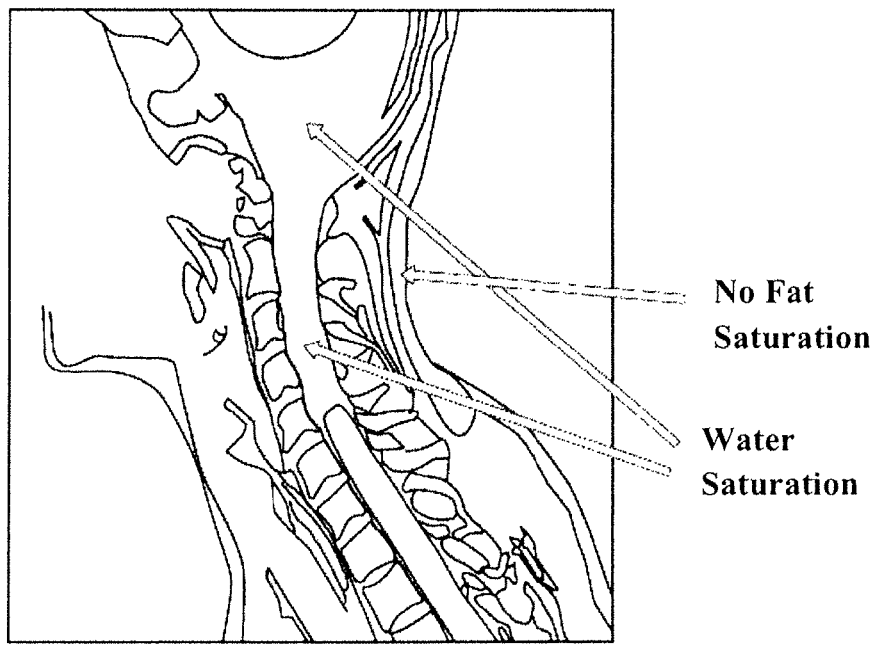
FIG. 4 shows the result of a fat saturation measurement in an inhomogeneous B0 field in accordance with FIG. 2.

In the case of a spectral fat saturation or water excitation measurement, on the basis of the inhomogeneous blurred main field in regions this causes severe image artifacts to arise, which is shown in FIG. 4: an undesirable water saturation can be seen in the in the spinal canal and brain (dark region) as well as a likewise undesirable fat signal in the cervical vertebral column region (no fat saturation possible, fat as bright region). The cause for this is the fact that the RF saturation pulse radiated prior to the actual imaging sequence on the basis of the magnetic field shifting (field blurring) and hence of a resonance deviation causes undesirable saturation or non-saturation.

Therefore, according to the current state of the art, it is not possible in body regions which exhibit critical susceptibility changes and with this severe $B_0$ field changes, to precisely determine both the region specific MR resonance of the water as well as also on the basis of such a determination to bring about a complete suppression of the fat signal or sole excitation of the water signal over the entire region.

To solve this problem, corresponding to the present invention, the following approach is implemented.

First the local or spatial region that is to be measured is specified, e.g. the back of the head with the neck and the cervical vertebral column in the upper shoulder region. Additionally all sub-coils of the RF coil arrangement are determined whose image field comes to rest in the field to be measured. These are for example the fourth of four head coils (Head4 or HE4), both neck coils (Neck1 and Neck2 or NE1, NE2) as well as the two uppermost back coils (Spinal1 and Spinal2 or SP1, SP2).

With each or some of these coils a frequency adjustment measurement is now carried out, advantageously with preceding shim measurement, wherein each of these frequency adjustment measurements yields a separate coil specific fat-water spectrum. Since each of these coils only covers a relatively small spatial region, the magnetic field in such a spatial region (of each partial coils measurement region) is to a great extent homogeneous. This results in each coil-specific fat-water spectrum also representing a clean doublet, in which the resonance frequency of water can be precisely determined for each coil. If the water-resonance frequencies of at least the adjacent partial coils have been determined with the help of the spectrums, with each resonance frequency and the coil assigned to this resonance frequency a fat saturations or a water excitation measurement is carried out.

In this way adjacent or contiguous images are obtained which are each in and of themselves free of artifacts and can be combined into a likewise artifact-free overall image, which finally represents a pure fat image or a pure water image.

Figure 5:
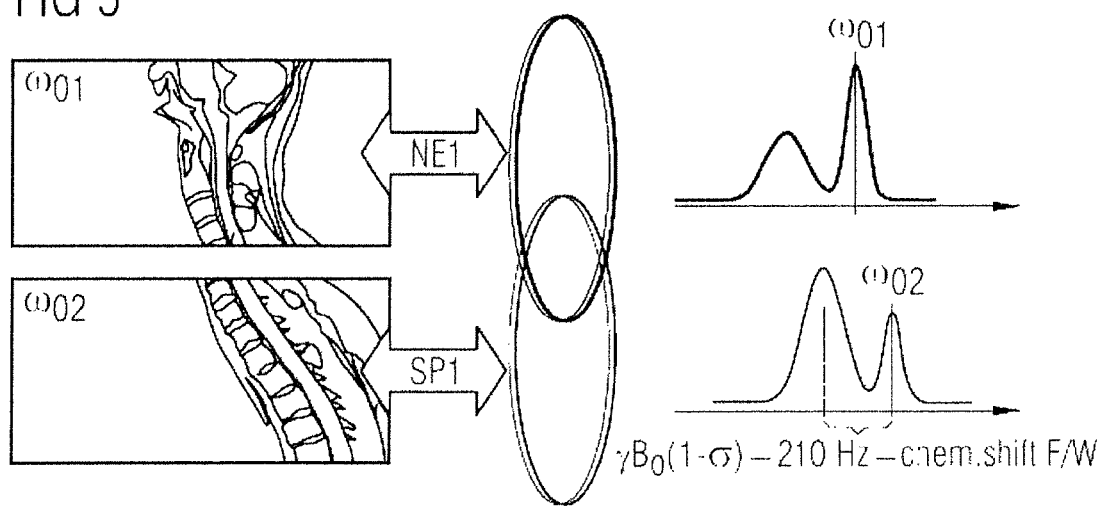
FIG. 5 shows the determining of water resonance frequencies at different coil locations by means of separate frequency adjustment measurement.

In FIG. 5 this is illustrated with the use of two sub-coils with associated spectrums: The neck region with the upper end of the vertebral column (upper region of the spinal canal) is specified as the local space to be measured. The local space is covered by the measuring region (FOV) of the neck coil NE1 as well as by the adjacent partially overlapping spinal canal coil SP1.

The magnetic fields of both measuring regions are homogenous, so that after a frequency adjustment measurement (and a preceding shim measurement) each partial coil yields a clean doublet as a fat-water spectrum. The coil NE1 can be assigned precisely the water resonance frequency $\omega_{01}$, the coil SP1 can be assigned precisely the frequency $\omega_{02}$. The saturation measurement with both coils in the case of the respective resonance frequency yields pure water images which are combined to an artifact-free overall image of the upper spinal region. According to the inventive method thus images are obtained from adjacent but different regions.

However, because every region yields a unique spectrum, a unique water excitation can be achieved over the totality of the regions. Frequency or field inhomogeneity regions, which are swept in the case of large image regions, can be compensated by the inventive method.

The overall image can e.g. be reconstructed by SoS addition of the fat saturated or water excited partial images (SOS: Sum-of-Square). Since all partial images have been acquired in chronological sequence, in the case of an SoS addition a long-term averaging arises, which as a rule has a positive effect on the quality of the overall image.

Another possibility of large-scale imaging from a number of adjacent homogeneous partial coil images consists in the application of the parallel partial acquisition technique and subsequent reconstruction with corresponding algorithms (iPAT-algorithms).

A PAT or PPA based measurement has the advantage that in spite of the recording of several partial images the measuring time is not prolonged, since each partial coil image in the k space is only incompletely sampled and hence the overall sampling time does not change after combination of the partial images. In a typical PPA acquisition namely in comparison to the conventional acquisition in correspondence to the suitable coil number only a fraction (½, ⅓, ¼, etc.) of the phase coded lines are acquired and hence the measuring time is reduced. A reconstruction corresponding especially to the respective PPA technique (iPAT algorithm) is then applied on the data in order to reconstruct the missing k-space lines and with it to obtain the full Field-of-View (FOV-) image in a fraction of the time. The respective reconstruction method (the iPAT algorithm), which as a rule constitutes an algebraic method, corresponds to the respective PPA technique. A slight frequency offset in read-out direction can be corrected prior to the iPAT calculation. The currently best known PPA techniques are image space based methods like SENSE (Sensitivity Encoding) and k space based methods like GRAPPA (Generalized Autocalibration PPA) with their respective derivatives.

Figure 6:
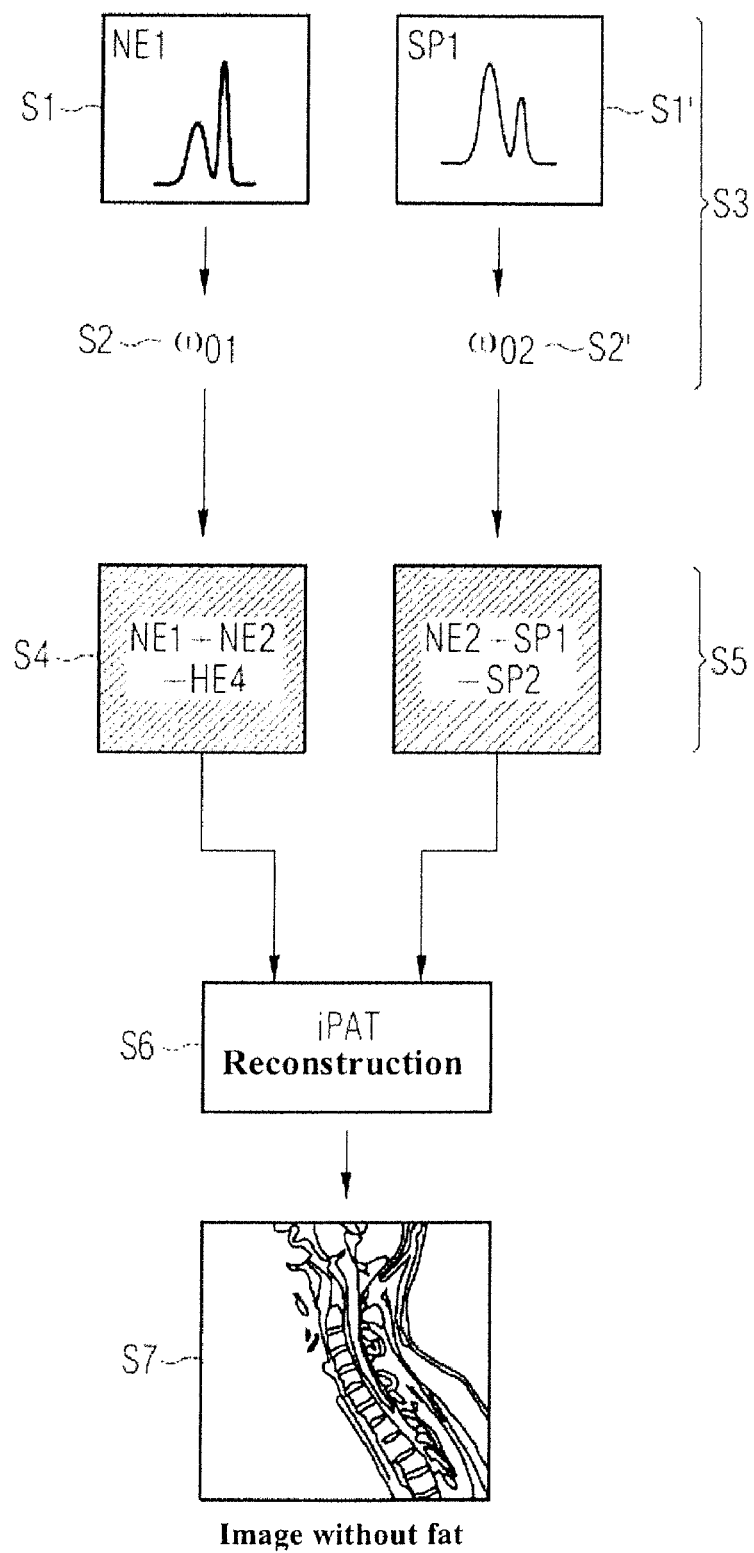
FIG. 6 shows a procedural flow chart of the inventive method.

The inventive method will now be summarily illustrated with the help of the method flow chart in FIG. 6:

In this example, it is desired to obtain an MR image of the region of the neck, in particular the upper region of the spinal canal of a patient that is free of artifacts and free of fat. For this purpose in a first step S1 a frequency adjustment measurement is performed with the neck coil NE1 and optionally a preceding shim measurement is performed, as a result of which a first fat-water spectrum is obtained. In a second step S2, from the obtained spectrum, the resonant frequency of the water $\omega_{01}$ is determined. Steps S1 and S2 are repeated with the spinal coil SP1 (Steps S1 and S2'), as a result of which an additional spectrum and an additional resonance frequency of the water $\omega_{02}$ is obtained.

In a third step S3, in the case of the resonant frequency of the MR system set to $\omega_{01}$ with head and neck coils NE1, NE2 and HE4 consolidated in terms of circuit design, an undersampled k-space data record is acquired using a PPA technique on the basis of a fat saturation sequence.

Step S3 is repeated with the second resonance frequency $\omega_{02}$ resulting from the repetition of Steps S1 and S2 and with the neck and spinal coils NE2, SP1 and SP2 consolidated in terms of circuit design (Step S3') and an additional undersampled k space data record is obtained.

In a fourth step S4 the undersampled k space data records obtained in Steps S3 and S3' are completed and combined using PPA technology, as a result of which in a Step 5 an MR image free of artifacts and fat is obtained.

It is noted that the above described method can be modified:

Step S1 can also be carried out with a sub-coil combination of several sub-coils. The requirement for this is that a unique spectrum is obtained which makes possible a precise determination of the water resonance frequency of this coil combination.

In Step S2 the determination of the resonance frequency of fat can also take place in order to obtain pure fat images.

Steps S1 and S2 can be repeated with other coils and/or coil combinations expanding the overall image. The inventive method hence can be expanded to multiple frequency adjustment measures with the corresponding measurements and evaluations.

Instead of a spectral fat saturation sequence a spectral water excitation sequence can also be applied.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance tomography image with spectral fat saturation or spectral water excitation in a tissue region of a patient using a magnetic resonance tomography (MRT) data acquisition unit, said tissue region comprising varying magnetic susceptibility values that induce substantial magnetic field inhomogeneities in a main magnetic field of said MRT data acquisition unit, said method comprising the steps of:

(1) placing a patient, comprising said tissue region, in said MRT data acquisition unit, said MRT data acquisition unit comprising a radio-frequency antenna arrangement comprising a plurality of sub-coils, each having a field of view that encompasses at least a portion of said tissue region, and making a frequency adjustment measurement of said tissue region using a sub-coil entity, comprised of at least one of said sub-coils, to obtain a first clean doublet frequency spectrum in which fat and water respectively exhibit resonant frequencies due to a field of view of said sub-coil entity, wherein said field of view of said sub-coil entity is selected to cover a sufficiently small portion of said tissue region such that said main magnetic field is substantially homogenous therein;

(2) in a processor, determining the resonant frequency of water in said first frequency spectrum;

(3) making another frequency adjustment measurement of said tissue region of the patient using a second sub-coil entity, different from and adjacent to said first sub-coil entity, to obtain a second clean doublet frequency spectrum from said tissue region in which fat and water exhibit respective resonant frequencies due to a field of view of said second sub-coil entity, and determining the resonant frequency of water in said tissue region in said second frequency spectrum, wherein said field of view of said second cub-coil entity is selected to cover a sufficiently small portion of said tissue region such that said main magnetic field is substantially homogenous therein;

(4) implementing a magnetic resonance data acquisition sequence for the patient in the data acquisition unit to acquire a k-space data record using a diagnostic data sub-coil entity that includes one of said first sub-coil entity or said second sub-coil entity, and operating said data acquisition unit at a frequency corresponding to the resonant frequency of water determined for the sub-coil entity that is used as said diagnostic data coil entity;

(5) repeating Step (4) with other sub-coils in said plurality of sub-coils until magnetic resonance data from an entirety of said tissue region are acquired;

(6) combining the respective k-space data records acquired in Steps (4) and (5), to obtain a combined k-space data record; and (7) in an image computer, generating a magnetic resonance image of said tissue region from said combined k-space data record.

2. A method as claimed in claim 1 comprising combining said k-space data records in Step (6) using sum of squares addition of respective entries in said k-space data records.

3. A method as claimed in claim 1 comprising acquiring said k-space data record in Steps (4) and (5) using a magnetic resonance imaging sequence selected from the group consisting of a spectral fat saturation sequence and a spectral water excitation sequence.

4. A method as claimed in claim 1 comprising performing the frequency adjustment measurements in Steps (1) and (3) before shimming said tissue region.

5. A non-transitory computer-readable storage medium encoded with programming instructions, said storage medium being loaded into a computerized control and processing system of a magnetic resonance imaging (MRI) apparatus for examining a patient, comprising a data acquisition unit comprising a radio-frequency antenna arrangement comprising a plurality of sub-coils, each of said sub-coils having a field of view that at least partially encompasses a tissue region of the patient, said tissue region comprising varying magnetic susceptibility values that induce substantial magnetic field inhomogeneities in a main magnetic field of said MRI apparatus, said programming instructions causing said computerized control and processing system to:

(1) for the patient placed in the data acquisition unit, make a frequency adjustment measurement of said tissue region using a sub-coil entity, comprised of at least one of said sub-coils, to obtain a first clean doublet frequency spectrum in which fat and water respectively exhibit resonant frequencies due a field of view of said sub-coil entity, wherein said field of view of said sub-coil entity is selected to cover a sufficiently small portion of said tissue region such that said main magnetic field is substantially homogenous therein;

(2) determine the resonant frequency of water in said first frequency spectrum;

(3) make another frequency adjustment measurement of said tissue region of the patient using a second sub-coil entity, different from and adjacent to said first sub-coil entity, to obtain a second clean doublet frequency spectrum from said tissue region in which fat and water exhibit respective resonant frequencies due a field of view of said second sub-coil entity, and determining the resonant frequency of water in said tissue region in said second frequency spectrum, wherein said field of view of said second cub-coil entity is selected to cover a sufficiently small portion of said tissue region such that said main magnetic field is substantially homogenous therein;

(4) implement a magnetic resonance data acquisition sequence for the patient in the data acquisition unit to acquire a k-space data record using a diagnostic data sub-coil entity that includes one of said first sub-coil entity or said second sub-coil entity, and operating said data acquisition unit at a frequency corresponding to the resonant frequency of water determined for the sub-coil entity that is used as said diagnostic data coil entity;

(5) repeat Step (4) with other sub-coils in said plurality of sub-coils until magnetic resonance data from an entirety of said tissue region are acquired;

(6) combine the respective k-space data records acquired in Steps (4) and (5), to obtain a combined k-space data record; and (7) generate a magnetic resonance image of said tissue region from said combined k-space data record.

* * * * *